(12) United States Patent
Brewer et al.

(10) Patent No.: US 9,536,844 B1
(45) Date of Patent: Jan. 3, 2017

(54) TRANSIENT ANTENNAS AND TRANSIENT ELECTRONICS

(71) Applicant: HRL Laboratories, LLC, Malibu, CA (US)

(72) Inventors: Peter D. Brewer, Westlake Village, CA (US); Dana C. Wheeler, Santa Monica, CA (US); Tahir Hussain, Calabasas, CA (US); Kyung-Ah Son, Moorpark, CA (US); Hyok J. Song, Camarillo, CA (US); Harris P. Moyer, Los Angeles, CA (US); Joseph S. Colburn, Malibu, CA (US); James H. Schaffner, Chatsworth, CA (US)

(73) Assignee: HRL Laboratories, LLC, Malibu, CA (US)

( * ) Notice: Subject to any disclaimer, the term of this patent is extended or adjusted under 35 U.S.C. 154(b) by 89 days.

(21) Appl. No.: 14/678,512

(22) Filed: Apr. 3, 2015

Related U.S. Application Data

(63) Continuation-in-part of application No. 14/677,843, filed on Apr. 2, 2015.
(Continued)

(51) Int. Cl.
| | |
|---|---|
| *H01L 27/144* | (2006.01) |
| *H01L 23/66* | (2006.01) |
| *H01L 23/00* | (2006.01) |
| *H01L 23/498* | (2006.01) |
| *H01L 29/167* | (2006.01) |

(Continued)

(52) U.S. Cl.
CPC .......... *H01L 23/66* (2013.01); *H01L 23/4985* (2013.01); *H01L 23/49866* (2013.01); *H01L 23/49894* (2013.01); *H01L 23/57* (2013.01); *H01L 29/167* (2013.01); *H01L 29/32* (2013.01); *H01Q 1/02* (2013.01); *H01Q 1/14* (2013.01); *H01L 2223/6677* (2013.01)

(58) Field of Classification Search
CPC ............................ H01L 27/144; H01L 27/305
USPC ......................................................... 257/428
See application file for complete search history.

(56) References Cited

U.S. PATENT DOCUMENTS

| | | | | |
|---|---|---|---|---|
| 8,877,521 B2 * | 11/2014 | Tanabe | ............. | H01L 27/11502 257/E21.664 |
| 2006/0180832 A1 * | 8/2006 | Lai | ........................ | H01L 21/263 257/192 |

* cited by examiner

*Primary Examiner* — Cuong Q Nguyen
(74) *Attorney, Agent, or Firm* — O'Connor & Company

(57) ABSTRACT

The disclosed antenna structures and electronic microsystems are capable of physically disappearing in a controlled, triggerable manner. Some variations provide an on-chip transient antenna comprising a semiconductor substrate containing ion-implanted hydrogen atoms and a conductor network comprising metals bridged by low-melting-temperature metals. Some variations provide an off-chip transient antenna comprising a flexible substrate containing a polymer, nanoporous silicon particles, and an oxidant for silicon, and a conductor network comprising metals bridged by low-melting-temperature metals. Other variations provide a method of introducing physical transience to a semiconductor integrated circuit, comprising thinning a substrate from the back side, implanting hydrogen ions into the thinned substrate to introduce latent structural flaws, depositing a semiconductor integrated circuit or sensor chip, and providing a controllable heating source capable of activating the latent structural flaws. These novel approaches are compatible with existing integrated circuits processing, preserve antenna performance, and use foundry-compatible techniques.

20 Claims, 6 Drawing Sheets

Related U.S. Application Data

(60) Provisional application No. 61/974,856, filed on Apr. 3, 2014, provisional application No. 61/974,856, filed on Apr. 3, 2014.

(51) Int. Cl.
*H01L 29/32* (2006.01)
*H01Q 1/02* (2006.01)
*H01Q 1/14* (2006.01)

TRANSIENT ANTENNAS AND TRANSIENT ELECTRONICS

PRIORITY DATA

This patent application is a non-provisional application claiming priority to U.S. Provisional Patent App. No. 61/974,856, filed on Apr. 3, 2014, which is hereby incorporated by reference herein. This patent application is also a continuation-in-part application of U.S. patent application Ser. No. 14/677,843, filed on Apr. 2, 2015, which is hereby incorporated by reference herein.

FIELD OF THE INVENTION

The present invention generally relates to antennas, electronics, and other systems that are designed to be physically disintegrated remotely.

BACKGROUND OF THE INVENTION

An antenna is an electrical device which converts electric power into radio waves, and vice versa. It is usually used with a radio transmitter or radio receiver. In transmission, a radio transmitter supplies an electric current oscillating at radio frequency to the antenna's terminals, and the antenna radiates the energy from the current as electromagnetic waves. In reception, an antenna intercepts some of the power of an electromagnetic wave in order to produce a tiny voltage at its terminals, applied to a receiver to be amplified. Antennas are essential components of all equipment that use radio. They are used in systems such as radio broadcasting, broadcast television, two-way radio, communications receivers, radar, cell phones, and satellite communications, as well as other devices such as wireless microphones, Bluetooth-enabled devices, and wireless computer networks. Antennas are critical components for military operations.

Modern electronic microsystems can now be made at such low cost that they are increasingly pervasive throughout the battlefield and large numbers can be widely proliferated and used for applications such as distributed remote sensing and communications. However, it is nearly impossible to track and recover every device, resulting in unintended accumulation in the environment as well as subsequent unauthorized use and compromise of technological advantage.

Transient electronics promise a number of revolutionary and meaningful military capabilities of interest including sensors for conventional indoor/outdoor environments (e.g., buildings, transportation, and material), environmental monitoring over large areas, and simplified diagnosis, treatment, and health monitoring in the field. Large-area distributed networks of sensors that can disintegrate into powders independent the natural environment may provide critical data for a specified duration, but no longer. Alternatively, devices that resorb into the body (bioresorbable) could be promising transient electronic implants to aid in continuous health monitoring and treatment in the field. Potential applications and enhanced capabilities are plentiful. The addition of transience as a design variable introduces and may enable new operational strategies.

To date, the challenge of creating fully physically transient electronics including antennas has been addressed primarily through approaches in which the fundamental elements of electronic circuits (actives, passives, etc.) are created from fully physically transient materials and integrated onto transient substrates.

A known approach provides water-soluble devices and substrates (see Hwang et al., *Science* 337, 1640-1644, 2012). In this approach, transience is achieved through a selection of materials (ultra-thin silicon, magnesium, silk) that trades improved water solubility for degraded electrical performance. While there are scenarios in which such trades are permissible—as in certain in vivo biomedical applications—most military electronics requirements are of a level of performance and complexity out of the reach of even the most sophisticated of transient circuits.

The shortcomings of existing transient electronics solutions are particularly problematic when considered in the context of RF electronics and general-purpose digital logic, for which high operating frequencies and on-off ratios are required. Furthermore, water-soluble materials are at odds with commonly used wafer-processing techniques. This fact, when considered with CMOS foundries' resistance to exotic materials, makes it unlikely that such approaches to transient electronics will be adopted by high-volume manufacturers.

Any solubility-based approach requires either an on-board solvent reservoir, which is easily defeated by removal or deactivation of the release valve; an external supply of the solvent, which cannot be guaranteed in all deployment scenarios; or an on-board means of synthesizing the solvent, which adds complexity to the system design. In any case, these requirements likely restrict the domain of transient electronics technology to low-volume manufacturing and niche applications.

Conventional methods to protect and safeguard military or other intelligence assets involve large-scale combustion or energetic reactions that provide brute-force destruction. While effective in providing a triggered transience, their lack of control on particle size and their potential for detrimental effects on innocent bystanders, handlers, and the environment have severely limited their use.

Most anti-reverse-engineering schemes revolve around protecting a device's software/data and hardware. These schemes fall into two major categories: proactive and reactive. An example of a proactive software scheme is encryption, where a known algorithm and key are used to encode/decode data. An example of a reactive software scheme is the zeroization of data, which repeatedly erases content such that it is physically unrecoverable.

Hardware-based schemes may also be categorized as proactive and reactive. One proactive hardware scheme employs encapsulation or coatings that attempt to prevent probing of the device or silicon die analysis. A reactive hardware protection scheme is overvoltage, which is employed during tamper detection. Overvoltage produces a voltage spike large enough to irreversibly damage the internal circuitry, rendering it nonfunctional. Another less sophisticated, but often used, hardware protection scheme employs explosives or acids to physically destroy the hardware. While reasonably effective, all of the aforementioned protection methods, at best, leave traces behind that could be used to determine vital information and, at worst, endanger the lives of warfighters and threaten the environments in which they are deployed.

Reactive materials for wafer-scale energetics are capable of delivering localized heat, pressure, or shock, which provide a unique capability for protecting sensor and electronic platforms. These materials can generally be classified into four major categories: nanothermites, intermetallics, inkjet-printable secondary, and nanoporous silicon. Nanothermites such as aluminum/copper oxide generate significant heat and pressure. Reaction temperatures can reach upwards of 3000 K while achieving an output energy of 4 kJ/g. Intermetallics like nickel/aluminum have the benefit of generating heat as a byproduct of their exothermic reaction, reaching temperatures of 1600 K. Inkjet deposition of secondary explosives delivers enormous shock waves that can be rapidly transferred to targeted devices. Nanoporous energetic silicon consisting of oxidizer-infused porous silicon can deliver heat, pressure, and shock, making it one of the most versatile reactive materials available.

Among the reactive materials described, nanoporous silicon can be most readily integrated on-chip with MEMS and electronic platforms because the material is fabricated directly from silicon. This monolithic fabrication is done by etching the silicon and converting the device wafer into a silicon fuel that can be infused with an oxidizer. The exothermic reaction can be tailored to achieve a controlled release of energy. While intermetallics can be fabricated using MEMS microfabrication techniques, they can be sensitive and require in-line mixers with ultrasonics and peristaltic pumps. Nanothermites do not readily lend themselves to direct on-chip integration because they are slurry-based materials. While inkjet secondary materials can provide significant, targeted damage, they lack the controlled energy delivery of nanoporous silicon, which can be tuned to deliver precise amounts of targeted energy while residing on-chip.

What are desired are antenna structures and other microsystem components capable of physically disappearing in a controlled, triggerable manner. Transient antennas should maintain designs and performance similar to state-of-art permanent antennas, but with controllable persistence that can be programmed, adjusted in real-time, triggered, and/or be sensitive to the deployment environment.

While there are a wide range of candidate approaches to achieving physical transience (explosives, caustic-chemical-based dissolution, burning, etc.), what are desired are approaches that are fully compatible with existing integrated circuits processing, preserving antenna performance while using foundry-compatible, front-end and post-process techniques.

SUMMARY OF THE INVENTION

The present invention addresses the aforementioned needs in the art, as will now be summarized and then further described in detail below.

Some variations provide an on-chip transient antenna comprising:

(a) a semiconductor substrate having a front side and back side, wherein the semiconductor substrate contains ion-implanted interstitial hydrogen atoms, and wherein the semiconductor substrate is thermally disintegrable; and (b) a conductor network, disposed on the front side of the semiconductor substrate, comprising a plurality of arrays of first metal conductors and second metal conductors, wherein the first metal conductors are bridged or strapped by the second metal conductors, and wherein the second metal conductors include one or more low-melting-temperature metals with melting point less than 750° C., or a metallic mesh.

In some embodiments, the semiconductor substrate comprises one or more materials selected from the group consisting of silicon, silicon dioxide, aluminum oxide, sapphire, germanium, gallium arsenide, indium phosphide, silicon carbide, and combinations thereof.

The interstitial hydrogen atoms may be ion-implanted from the back side of the semiconductor substrate. These implanted interstitial hydrogen atoms may be disposed in a three-dimensional grid pattern within the semiconductor substrate, characterized by a grid spacing of about 200 microns or less, in some preferred embodiments.

Optionally, the semiconductor substrate further contains a co-implant selected from the group consisting of boron, phosphorous, silicon, aluminum, germanium, carbon, gallium, indium, arsenic, and combinations thereof.

In certain embodiments, the semiconductor substrate comprises silicon, the semiconductor substrate further contains co-implanted boron atoms, and the interstitial hydrogen atoms and the boron atoms are ion-implanted from the back side of the semiconductor substrate.

The first metal conductors may include copper, silver, gold, aluminum, or a combination thereof, for example. The second metal conductors may include indium, tin, aluminum (when the first metal conductor is not aluminum), gold-indium alloy, copper-tin alloy, gold-tin alloy, a silver nanowire array, or a combination thereof.

In some embodiments, the first metal conductors are bridged or strapped by the second metal conductors both parallel and perpendicular relative to a conductor trace direction.

The metal line widths of the first metal conductors and/or the second metal conductors are about 200 microns or less, in some preferred embodiments.

Other variations of the invention provide an off-chip transient antenna comprising:

(a) a flexible substrate containing a polymer, nanoporous silicon particles, and an oxidant for silicon, wherein the flexible substrate is thermally disintegrable; and (b) a conductor network, disposed on the flexible substrate, comprising a plurality of arrays of first metal conductors and second metal conductors, wherein the first metal conductors are bridged or strapped by the second metal conductors, and wherein the second metal conductors include one or more low-melting-temperature metals with melting point less than 750° C., or a metallic mesh.

In some embodiments, the polymer comprises polytetrafluoroethylene or another fluorinated polymer. In various embodiments, the polymer is selected from the group consisting of polyvinylfluoride, polytetrafluoroethylene, polyvinylidene fluoride, polychlorotrifluoroethylene, perfluoroalkoxy polymer, polyethylenetetrafluoroethylene, and combinations thereof.

In some embodiments, the oxidant for silicon is selected from the group consisting of a perchlorate, a perfluoropolymer, a metal oxide, a permanganate, sulfur, and combinations, precursors, or derivatives thereof.

The first metal conductors may include copper, silver, gold, aluminum, or a combination thereof, for example. The second metal conductors may include indium, tin, aluminum (when the first metal conductor is not aluminum), gold-indium alloy, copper-tin alloy, gold-tin alloy, a silver nanowire array, or a combination thereof.

In some embodiments of the off-chip transient antenna, the first metal conductors are bridged or strapped by the second metal conductors both parallel and perpendicular relative to a conductor trace direction. The metal line widths of the first metal conductors and/or the second metal conductors are about 200 microns or less, in some preferred embodiments.

Certain variations provide an off-chip transient antenna comprising:

(a) a flexible substrate containing a polymer, nanoporous silicon particles and an oxidant for silicon, wherein the flexible polymeric substrate is thermally disintegrable; and (b) a conductor, disposed on the flexible substrate, comprising a shape-changing nanowire that recoils into nanospheres upon heating.

In some embodiments, the polymer comprises polytetrafluoroethylene or another fluorinated polymer. In various embodiments, the polymer is selected from the group consisting of polyvinylfluoride, polytetrafluorethylene, polyvinylidene fluoride, polychlorotrifluoroethylene, perfluoroalkoxy polymer, polyethylenetetrafluoroethylene, and combinations thereof.

In some embodiments, the oxidant for silicon is selected from the group consisting of a perchlorate, a perfluoropolymer, a metal oxide, a permanganate, sulfur, and combinations, precursors, or derivatives thereof. In certain embodiments, the nanowire comprises silver.

Other variations of the invention provide a method of introducing physical transience to a semiconductor integrated circuit or sensor chip, the method comprising:

(a) fabricating or obtaining a semiconductor integrated circuit or sensor chip substrate having a front side and back side;

(b) thinning the substrate from the back side, to form a thinned substrate;

(c) implanting hydrogen ions into the back side of the thinned substrate, thereby introducing latent structural flaws in the substrate;

(d) depositing a semiconductor integrated circuit or sensor chip on the front side of the substrate; and (e) providing a controllable heating source, within, or in operable communication with, the semiconductor integrated circuit or sensor chip, wherein the controllable heating source is capable of activating the latent structural flaws.

In some embodiments of these methods, the semiconductor integrated circuit or sensor chip substrate comprises one or more materials selected from the group consisting of silicon, silicon dioxide, aluminum oxide, sapphire, germanium, gallium arsenide, indium phosphide, silicon carbide, and combinations thereof.

In some methods, step (c) includes implanting the hydrogen ions in the form of a three-dimensional grid with parallel and perpendicular planes relative to the back side. The three-dimensional grid may be characterized by an average grid spacing of about 200 microns or less.

The method may further include co-implanting additional ions or atoms to reduce activation energy of hydrogen release from the thinned substrate. The additional ions or atoms may be selected from the group consisting of boron, phosphorous, silicon, aluminum, germanium, carbon, gallium, indium, arsenic, and combinations thereof.

Step (c) may be conducted prior to step (d), following step (d), or simultaneously with step (d).

In some embodiments, the controllable heating source is an internal energy source contained within the thinned substrate. For example, the thinned substrate may include silicon and an oxidant for silicon, capable of controllably oxidizing the silicon to generate heat (exothermic reaction energy) as the heating source.

In these or other embodiments, the controllable heating source is an external energy source in operable communication with the semiconductor integrated circuit or sensor chip.

The method may further comprise introducing additional latent flaws directly in the semiconductor integrated circuit or sensor chip. The additional latent flaws may include one or more thermally disintegrable features.

For example, in certain embodiments, the thermally disintegrable features are present in a conductor network, disposed on the front side of the substrate, comprising a plurality of arrays of first metal conductors and second metal conductors, wherein the first metal conductors are bridged or strapped by the second metal conductors, and wherein the second metal conductors include one or more low-melting-temperature metals with melting point less than 750° C., or a metallic mesh. The second metal conductors may include indium, tin, aluminum, gold-indium alloy, copper-tin alloy, gold-tin alloy, a silver nanowire array, or a combination thereof. The first metal conductors may be bridged or strapped by the second metal conductors parallel and/or perpendicular relative to a conductor trace direction. The metal line widths of the first metal conductors and the second metal conductors are preferably about 200 microns or less.

In some embodiments of the invention, the semiconductor integrated circuit or sensor chip is a transient antenna or a portion thereof. In some embodiments, the semiconductor integrated circuit or sensor chip is a transient electronics device or system, or a portion thereof.

When physical disintegration is desired or triggered, the method further comprises converting (according to the principles disclosed herein) the semiconductor integrated circuit or sensor chip into micron-scale disintegrated particles.

DETAILED DESCRIPTION OF EMBODIMENTS OF THE INVENTION

Figure 1:
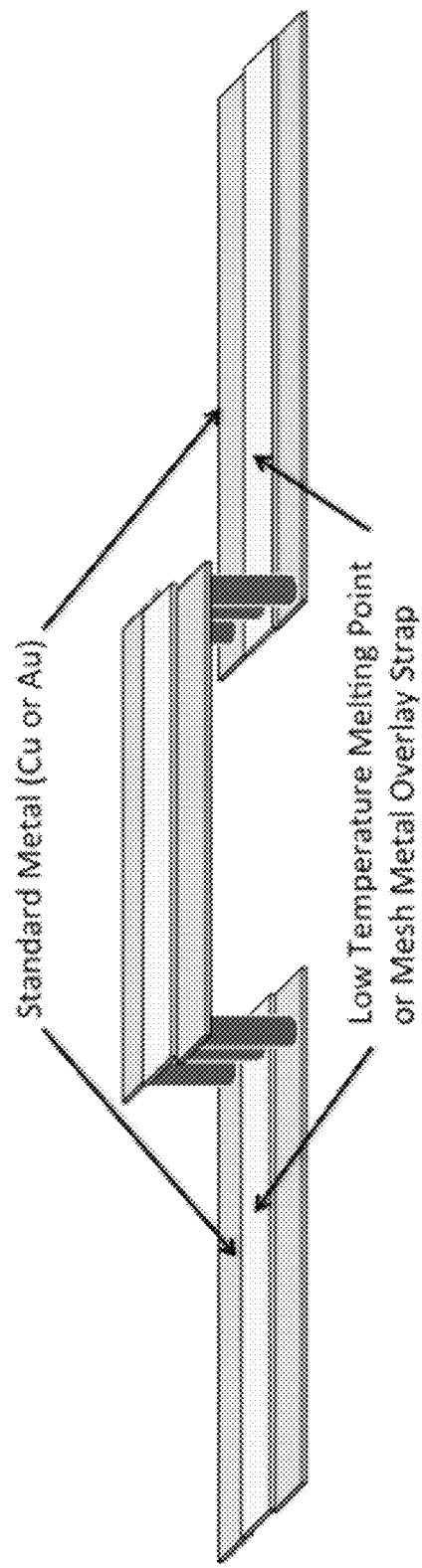
FIG. 1 depicts strategic positioning of low $T_m$ metal or metal mesh overlay straps connecting standard metal antenna conductors, enabling breakup of the conductor network in-line, in some embodiments.

The materials, compositions, structures, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Typically an antenna consists of an arrangement of metallic conductors, electrically connected (such as through a transmission line) to the receiver or transmitter. An oscillating current of electrons forced through the antenna by a transmitter will create an oscillating magnetic field around the antenna elements, while the charge of the electrons also creates an oscillating electric field along the conductors. Time-varying fields radiate away from the antenna into space as a moving transverse electromagnetic field wave. Conversely, during reception, the oscillating electric and magnetic fields of an incoming radio wave exert force on the electrons in the antenna conductors, causing them to move back and forth, creating oscillating currents in the antenna. An antenna, in converting radio waves to electrical signals or vice versa, is a form of transducer.

A new class of antenna is disclosed herein, suitable for conventional designs and performance but having the added ability to undergo triggered physical transience (disintegration). The disclosed approaches are compatible with existing integrated circuits processing, preserve antenna performance, and utilize foundry-compatible front-end and post-process techniques.

Note that in this disclosure, "antennas" should be construed broadly and without limitation to include conductors by which electromagnetic waves are sent out or received, electrical devices which convert electric power into radio waves and vice versa, structures or systems containing antennas, structures or systems containing conductors, transmitters, and/or receivers for transmitting, receiving, sensing, detecting, or otherwise interacting with electromagnetic waves or electromagnetic, electrical, photonic, magnetic, chemical, or physical derivatives of electromagnetic waves. "Antenna" may also refer broadly to an entire assembly including support structure, enclosure (if any), etc. in addition to the functional components. Especially at microwave frequencies, a receiving antenna may include not only the actual electrical antenna but also an integrated preamplifier or mixer.

According to the principles of this invention, antennas and other systems possess "physical transience," which means that such antennas and systems are capable of physically disintegrating in a controlled and/or triggerable manner. The disclosed transient antennas maintain designs and performance similar to state-of-art permanent antennas, but with controllable persistence that can be (i) programmed, (ii) adjusted in real-time, (iii) remotely triggered, and/or (iv) sensitive to the deployment environment. This invention utilizes engineered disintegration concepts and manufacturing-compatible process technology that will enable transient antennas to become a scalable and deployable technology.

Materials used in the construction of the antennas (substrates and conductors) are capable of undergoing physical, chemical, or structural changes under the influence of specific external stimuli. External stimuli may include, but are not limited to, thermal, electrical, electromagnetic (e.g. light, lasers, or impulses), sound, pressure, humidity, or other forces or environmental variables. Physical, chemical, or structural changes may be initiated according to a wide variety of factors, such as time, date, location, altitude, movement, sensed access, encryption failure, fingerprint detection, intelligence, or any other triggers. These factors may be inputs to a control algorithm to produce outputs comprising energy/heat, or any of the external stimuli described above, which in turn cause physical, chemical, or structural changes to the antennas. Such control may be configured within the antenna system itself, in a nearby computer or device, in a remote computer or server, within a cloud-computing system, or any combination thereof, for example.

Various combinations of transient antenna substrates and conductor materials allow a broad range of antenna designs including compact, integrated on-chip and flexible off-chip implementations. Exemplary antennas include engineered semiconductor substrates that undergo structural disintegration for on-chip antenna applications, and nanoporous silicon substrates that undergo chemical disintegration for off-chip antenna applications.

Antenna performance may be characterized by the efficiency of radiation. The efficiency of an antenna relates the power delivered to the antenna and the power radiated or dissipated within the antenna. A high-efficiency antenna has most of the power present at the antenna's input radiated away. A low-efficiency antenna has most of the power absorbed as losses within the antenna, or reflected away due to impedance mismatch. In some embodiments, the efficiency of radiation of a transient antenna is at least 10%, 20%, 30%, 40%, 50%, 60%, 70%, 80%, or greater.

On-Chip Transient Antennas

Some variations provide on-demand physical transience capability via disintegration mechanisms incorporated into the antenna substrate and conductors. For example, latent (dormant) structural flaws with precise spatial definition (e.g., planes, lines, and points) and chemical identity may be introduced into near-surface regions of a thinned integrated circuit chip. The structural flaws may be activated by a thermally triggered, nano-cleaving transience approach for engineered disintegration.

Heterogeneous integration enables access to the underside (back side), near-surface region of high-performance semiconductor electronics compatible with foundry manufacturing. This access allows incorporation of triggerable, three-dimensional cleavage planes through hydrogen/boron ion co-implantation with tailorable activation energies that, once activated, lead to the structural disintegration of the component. Subsurface cleavage and exfoliation of a semiconductor's near-surface layers by planar hydrogen implantation and subsequent heat treatment, combined with vertical implantation profiles from the underside (back side), near-surface region of a crystalline material, allows micron-scale cubing (disintegration).

The mechanisms governing the cleaving processes may include coalescence of implanted hydrogen, formation of micro-cracks, etc. Conventional hydrogen-implanted silicon wafers fracture parallel to the surface during heat treatment because regions of high internal pressure develop, created by the agglomeration of implanted hydrogen into $H_2$ bubbles. These bubbles are thought to nucleate at lattice defects created in the silicon crystal during the implantation or co-implantation process. Therefore, the distribution and density of defects that act as sites for the formation of bubbles play a crucial role in the rates and dynamics of the disintegration process. The underlying basis for hydrogen-induced layer exfoliation is the inherently low solubility ($\sim 10^7$ cm$^{-3}$) of hydrogen in silicon and its tendency to agglomerate on defect sites rather than be lost to the surface.

Some embodiments provide transient on-chip antennas with susceptibility for creation of cleavage planes perpendicular and parallel to the semiconductor electronics surface, creating a micro-cubing near the surface and leaving it in a state of decrepitation after triggered command.

A sensor may be integrated with an antenna. In some embodiments, when a sensor's substrate is triggered, the heat generated will trigger disintegration of an antenna substrate. In other embodiments, a separate trigger is added to the antenna substrate. In certain embodiments, the heat generated from the sensor substrate triggers the antenna substrate and there is also a separate trigger incorporated in the antenna substrate.

Transient Antenna Conductor Network

Engineered transience or disintegrability of an antenna substrate can provide a driving force for the breakdown of the antenna conductor network. Thermal transients may be used to initiate the disintegration process, and large structural changes may occur during the micro-cubing process. The natural scale of the breakup of the antenna conductor network is a function of the conductor network substrate.

Strategic engineering approaches may be employed to integrate triggerable breakpoints that define a substrate grid. The spacing in the grid may be selected so that resulting particulates (following disintegration) may be smaller than a certain size. When it is desired to generate imperceptible particulates (i.e. visual perception limit ~25 microns in diameter), metal line widths of the antenna conductors are preferably about 25 microns or less, in some embodiments. In various embodiments, metal line widths of the antenna conductors may be from about 5 microns to about 500 microns, such as about 10 microns to about 200 microns, e.g. about 25, 50, 75, 100, 125, 150, 175, or 200 microns. In some embodiments, metal line widths of the antenna conductors are greater than 25 microns.

Figure 2:
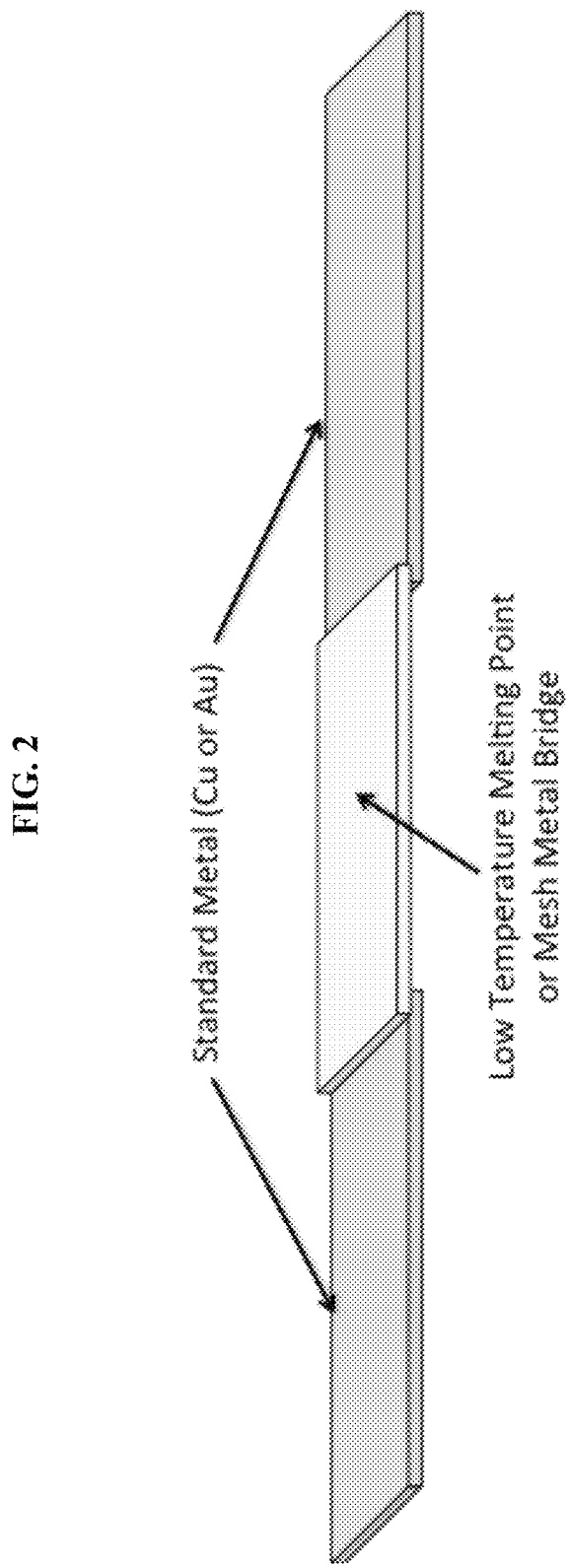
FIG. 2 depicts strategic positioning of low $T_m$ metal or metallic mesh bridges over cleavage planes, establishing natural break points for conductor network and substrate during physical disintegration, in some embodiments.

The conductors may include multiple parallel traces of standard interconnect metals (e.g. Cu or Au) bridged with low $T_m$ (melting temperature) metal or metallic mesh straps. "Low $T_m$" here means a melting point less than 750° C. This establishes break locations parallel to the direction of the conductor trace (see FIG. 1). To accommodate break points perpendicular to the trace direction, bridging straps may be incorporated (see FIG. 2). FIG. 1 depicts strategic positioning of low $T_m$ metal or metal mesh overlay straps connecting standard metal antenna conductors, enabling breakup of the conductor network in-line. FIG. 2 depicts strategic positioning of low $T_m$ metal or metallic mesh bridges over cleavage planes, establishing natural break points for conductor network and substrate during physical disintegration.

This arrangement allows comparable conductivities to be achieved in the transient antenna composed of the composite-conductor metallization, compared to permanent antenna analogs that use single-metal traces. Low $T_m$ bridging metal candidates such as Au/In ($T_m$=156° C.), Cu/Sn ($T_m$=231° C.), Au/Sn ($T_m$=280° C.), In ($T_m$=157° C.), Sn ($T_m$=232° C.), Al ($T_m$=660° C.) or metallic meshes such as silver-nanowire arrays are representative of metals that may be used for this purpose.

Some variations provide an on-chip transient antenna comprising:

(a) a semiconductor substrate having a front side and back side, wherein the semiconductor substrate contains ion-implanted interstitial hydrogen atoms, and wherein the semiconductor substrate is thermally disintegrable; and (b) a conductor network, disposed on the front side of the semiconductor substrate, comprising a plurality of arrays of first metal conductors and second metal conductors, wherein the first metal conductors are bridged or strapped by the second metal conductors, and wherein the second metal conductors include one or more low-melting-temperature metals with melting point less than 750° C., or a metallic mesh.

In some embodiments, the semiconductor substrate comprises one or more materials selected from the group consisting of silicon, silicon dioxide, aluminum oxide, sapphire, germanium, gallium arsenide, indium phosphide, silicon carbide, and combinations thereof.

The interstitial hydrogen atoms may be ion-implanted from the back side of the semiconductor substrate. These implanted interstitial hydrogen atoms may be disposed in a three-dimensional grid pattern within the semiconductor substrate. The three-dimensional grid pattern may be characterized by a grid spacing of about 500 microns or less, such as about or less than about 400, 300, 200, 100, 75, 50, 30, 25, 20, 15, or 10 microns in various embodiments. In some embodiments, the three-dimensional grid pattern is characterized by a grid spacing of about 25 microns or less. In other embodiments, the three-dimensional grid pattern is characterized by a grid spacing of greater than about 25 microns. In some embodiments, the three-dimensional grid pattern is characterized by a grid spacing of about 200 microns or less, such as from about 25 microns to about 200 microns.

Optionally, the semiconductor substrate further contains a co-implant selected from the group consisting of boron, phosphorous, silicon, aluminum, germanium, carbon, gallium, indium, arsenic, and combinations thereof. Any of these may be in atomic, molecular, ionic, or free-radical form.

In certain embodiments, the semiconductor substrate comprises silicon, the semiconductor substrate further contains co-implanted boron atoms, and the interstitial hydrogen atoms and the boron atoms are ion-implanted from the back side of the semiconductor substrate (i.e., the side opposite the device side).

The first metal conductors may include copper, silver, gold, aluminum, or a combination thereof, for example. The second metal conductors may include indium, tin, aluminum (preferably when the first metal conductor is not aluminum), gold-indium alloy, copper-tin alloy, gold-tin alloy, a silver nanowire array, or a combination thereof.

In some embodiments, such as in FIGS. 1 and 2 together, the first metal conductors are bridged or strapped by the second metal conductors both parallel and perpendicular relative to a conductor trace direction.

The metal line widths of the first metal conductors and/or the second metal conductors are about 200, 150, 100, 75, 50, 25 microns or less, in some preferred embodiments.

Off-Chip Transient Antennas

Some variations of the invention provide a new class of transient off-chip antennas employing energetic polymer-based substrates and wire designs. These designs may increase the available area for the antenna since there are no on-chip constraints, allow flexible structures for stowage or deployment, and provide efficient transmit and receive communication comparable to permanent antenna analogs.

Some variations provide an off-chip transient antenna comprising:

(a) a flexible substrate containing a polymer, nanoporous silicon particles, and an oxidant for silicon, wherein the flexible substrate is thermally disintegrable; and (b) a conductor network, disposed on the flexible substrate, comprising a plurality of arrays of first metal conductors and second metal conductors, wherein the first metal conductors are bridged or strapped by the second metal conductors, and wherein the second metal conductors include one or more low-melting-temperature metals with melting point less than 750° C., or a metallic mesh.

Flexible polymers or materials may be utilized to form a nanoporous Si composite ribbon structure that may be triggered thermally from a system-on-a-chip or by a separate trigger on the antenna substrate. In some embodiments, the flexible polymer is a fluoropolymer, such as (but not limited to) polytetrafluoroethylene (PTFE), polyvinylfluoride, polyvinylidene fluoride, polychlorotrifluoroethylene, polyethylenetetrafluoroethylene, perfluoroelastomer, perfluoropolyether, perfluorosulfonic acid, and fluorographene. In some embodiments, the polymer comprises polytetrafluoroethylene or another fluorinated polymer. In various embodiments, the polymer is selected from the group consisting of polyvinylfluoride, polytetrafluoroethylene, polyvinylidene fluoride, polychlorotrifluoroethylene, perfluoroalkoxy polymer, polyethylenetetrafluoroethylene, and combinations thereof.

In some embodiments, the oxidant for silicon is selected from the group consisting of a perchlorate, a perfluoropolymer, a metal oxide, a permanganate, sulfur, and combinations, precursors, or derivatives thereof. In some embodiments, the oxidant for silicon is selected from the group consisting of oxygen (or a gas comprising oxygen, such as air), ozone, water, hydrogen peroxide, liquid oxidants other than water (e.g., acidic oxidants such as peracetic acid), solid oxidants (e.g., metal oxides), and combinations, precursors, or derivatives thereof.

The first metal conductors may include copper, silver, gold, aluminum, or a combination thereof, for example. The second metal conductors may include indium, tin, aluminum (preferably when the first metal conductor is not aluminum), gold-indium alloy, copper-tin alloy, gold-tin alloy, a silver nanowire array, or a combination thereof.

In some embodiments of the off-chip transient antenna, the first metal conductors are bridged or strapped by the second metal conductors both parallel and perpendicular relative to a conductor trace direction. The metal line widths of the first metal conductors and/or the second metal conductors are about 500, 400, 300, 200, 100, 75, 50, 30, 25, 20, 15, 10 microns or less, in various embodiments.

Certain variations provide an off-chip transient antenna comprising:

(a) a flexible substrate containing a polymer, nanoporous silicon particles and an oxidant for silicon, wherein the flexible polymeric substrate is thermally disintegrable; and (b) a conductor, disposed on the flexible substrate, comprising a shape-changing nanowire that recoils or otherwise changes shape (such as into nanospheres) upon heating.

In some embodiments, the polymer comprises polytetrafluoroethylene or another fluorinated polymer. In various embodiments, the polymer is selected from the group consisting of polyvinylfluoride, polytetrafluoroethylene, polyvinylidene fluoride, polychlorotrifluoroethylene, perfluoroalkoxy polymer, polyethylenetetrafluoroethylene, and combinations thereof.

In some embodiments, the oxidant for silicon is selected from the group consisting of oxygen (or air), water, liquid oxidants other than water, solid oxidants, and combinations, precursors, or derivatives thereof. In some embodiments, the oxidant for silicon is selected from the group consisting of a perchlorate, a perfluoropolymer, a metal oxide, a permanganate, sulfur, and combinations, precursors, or derivatives thereof. In certain embodiments, the nanowire comprises or consists essentially of silver.

In some embodiments, off-chip antennas include a transient antenna substrate made from a porous silicon/polymer mixture that is embedded with an oxidant. The transient conductors may comprise composite metal traces or metallic nanowire meshes.

Figure 3:
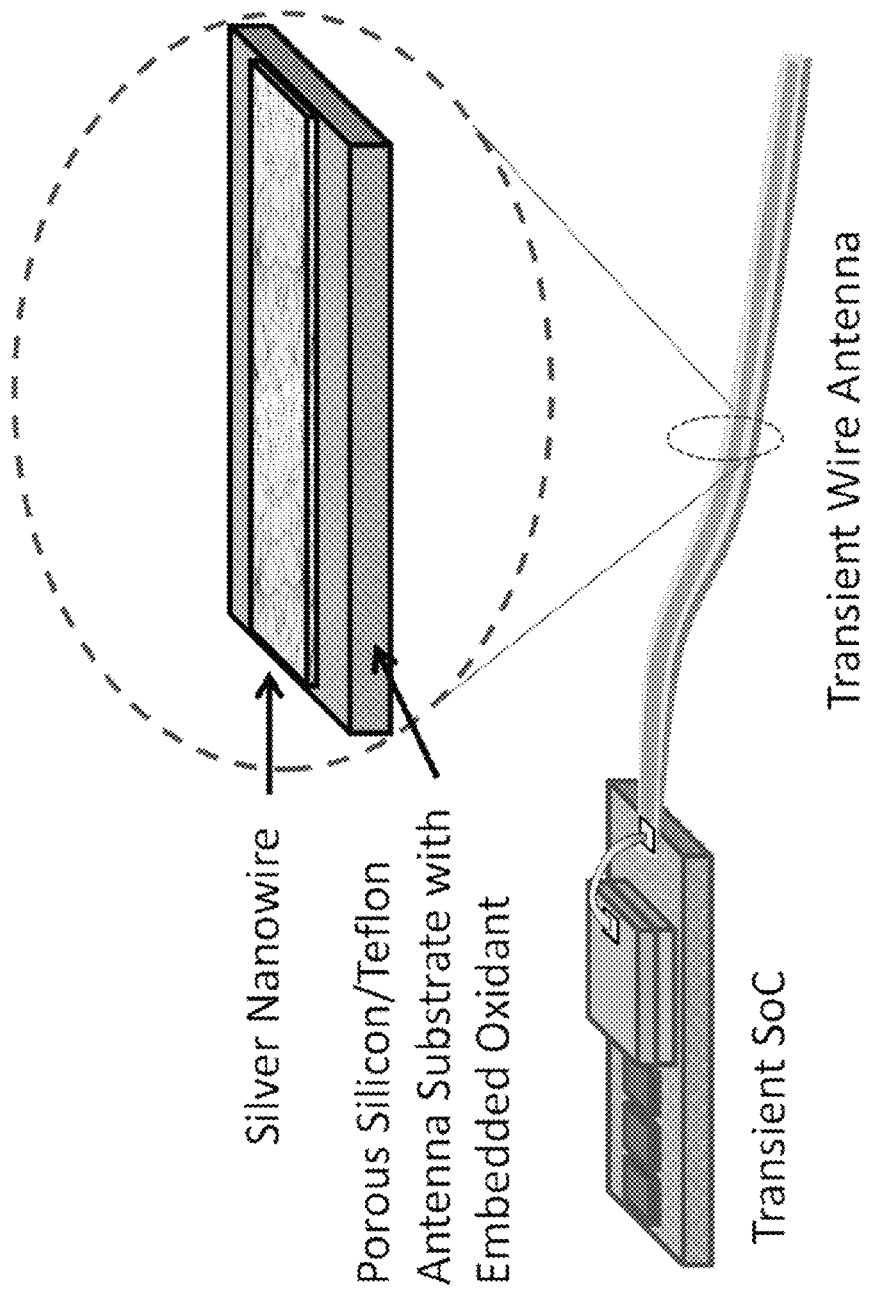
FIG. 3 illustrates a thin-wire monopole antenna attached to a sensor system-on-a-chip, in some embodiments of the invention.

A schematic illustration of the antenna is shown in FIG. 3, which is a non-scale drawing of a thin-wire monopole antenna attached to a sensor system-on-a-chip. An antenna conductor may be directly printed using metal nanowire inks or fabricated with composite metal conductor structures such as those disclosed above, for example. The disintegrable substrate may be fabricated from nanoporous Si/polymer composite ribbon structure that may be triggered thermally from the system-on-a-chip or by a separate trigger on the antenna substrate.

Adding PTFE or another flexible polymer to the porous Si creates a substrate that can be extruded or molded into a thin sheet. The thin sheet is preferably smooth to support standard lithography or printing of a conductive trace. The antenna may be a quarter-wave monopole attached to a sensor such that the substrate is touching the sensor's transient substrate. Radio-frequency connection may be made by a transient, extruded, porous-silver bond wire. Standard lithography may also be utilized between the antenna and the sensor chip.

While FIG. 3 illustrates a monopole concept, any wire antenna shape may be configured on the disintegrable substrate, such as dipoles, spirals, patch antennas, etc. Additionally, these compact designs permit direct patterning on the transient substrate, increasing the primary substrate footprint, but eliminating the need for a secondary, flexible substrate.

Figure 4A:
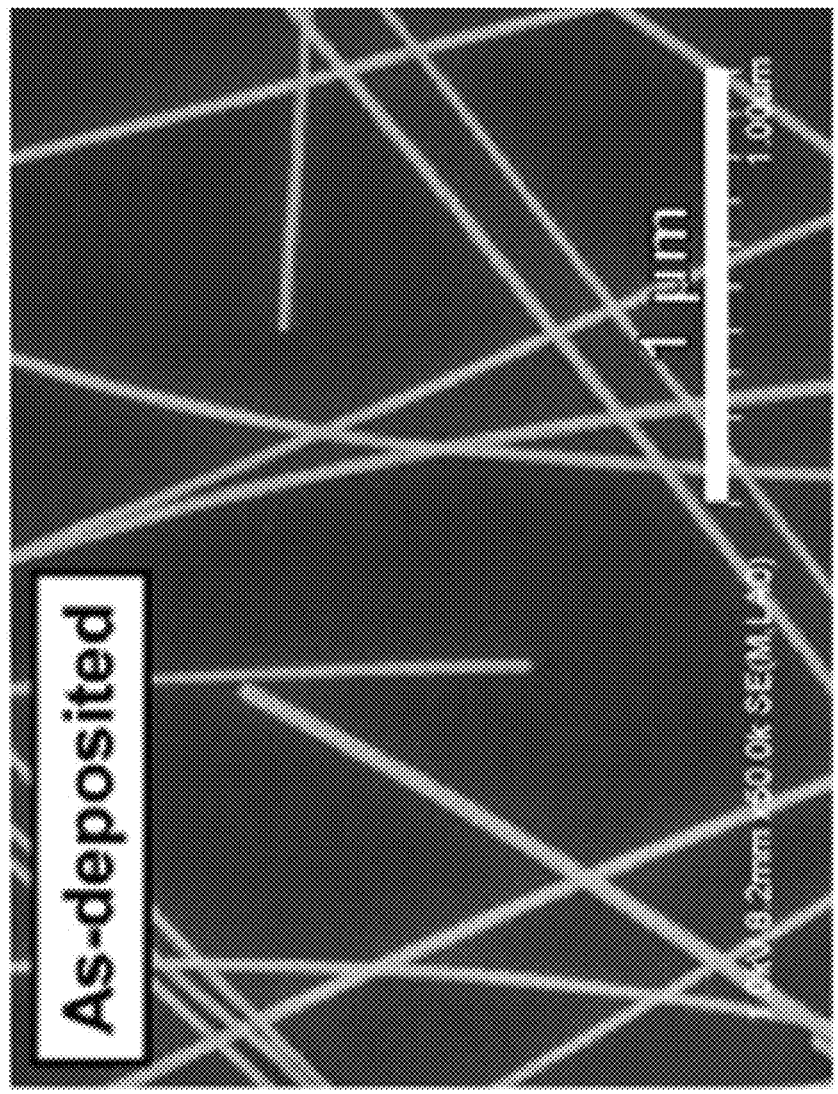
FIG. 4A shows an exemplary scanning electron micrograph of Ag-nanowire meshes deposited on silicon before exposure to heat.
Figure 4B:
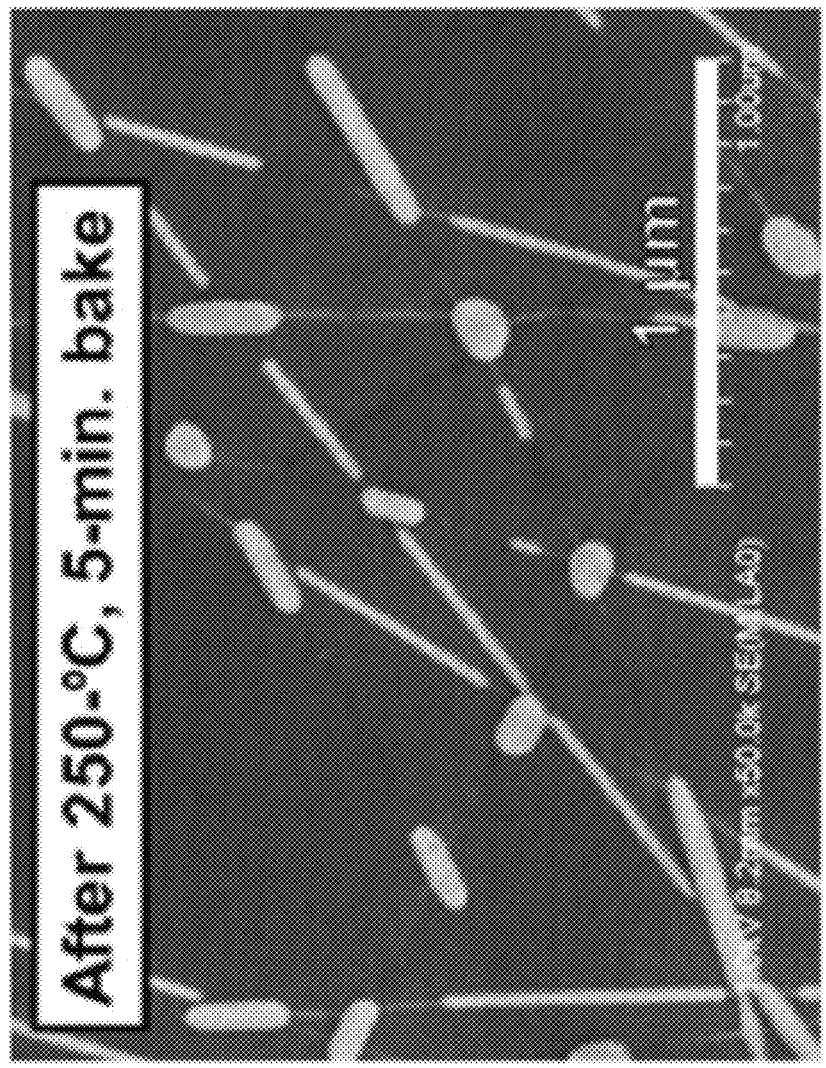
FIG. 4B shows an exemplary scanning electron micrograph of Ag-nanowire meshes deposited on silicon after exposure to 250° C. for 5 minutes.

Some embodiments utilize shape-changing silver nanowire meshes for transient antenna conductor elements. These silver nanowire meshes tend to recoil into nanometer-scale spheres upon heating. This provides a transient solution for antennas and other arbitrarily shaped conductive paths without requiring multi-metallization schemes. FIGS. 4A and 4B show a mesh of Ag nanowires deposited on a silicon substrate before and after, respectively, exposure to a 250° C. bake for 5 minutes.

As evidenced by the electron micrograph in FIG. 4B, continuity in the mesh is broken as the wires take on a spherical shape. The silver nanowires will undergo surface tension—mediated shape change that transforms the high-aspect-ratio wires into nanospheres (invisible to the naked eye) when the heat from the exothermic reaction of the disintegrating substrate takes place. This shape change also manifests itself in the macroscopic properties of the conductive material—the sheet resistance of the mesh increases from <50Ω/□ (ohms per square) before the bake to >105Ω/□ (ohms per square) after the bake, as measured by an eddy-current-based, non-contact, sheet-resistance measurement tool.

Silver nanowires may be spun on the substrate and then etched to the desired antenna shape. Consistent with commercial fabrication techniques, inkjet printers may be used (for example, a Fujifilm Dimatix materials printer), to print the antenna with silver nanowire. Silver nanowire inks are readily available from many sources, such as Seashell Technology (La Jolla, Calif., US). The sheet resistance of the silver nanowire layer may be optimized for efficiency, and the thickness of the substrate may be optimized for complete disintegration of the antenna.

In some variations, this invention discloses a method for engineering the triggerable disintegration of semiconductor electronic components. The method utilizes foundry-compatible integrated-circuit fabrication processes to build in dormant high-strain locations into the electronics or sensors. The high-strain locations are used to later (upon one or more triggers) break up the components into particulates, preferably imperceptible particulates, such as ~25 micron (or smaller) particulates. The process provides a low-cost, non-explosive, and non-combustive approach for incorporating programmable physical transience into traditionally long-life materials and components.

The disclosed methods to integrate semiconductor transience permits integrated circuits of arbitrary complexity to be made transient. The principles disclosed herein will be applicable to the semiconductor industry as it advances "More-than-Moore" technology, monolithically integrating high-performance SiGe, III-V, and microelectromechanical systems (MEMS) with silicon-based digital logic. Commercial system-on-chip devices that provide digital logic and basic radio-frequency (RF) links are inexpensive and readily available.

Some embodiments provide transient, complex, high-performance sensors and digital/RF integrated circuits through engineered disintegration. Transient functionality may be integrated into high performance and commercial off-the-shelf electronics and sensors (or derivatives thereof) using foundry-compatible integrated-circuit fabrication processes (e.g., ion implantation, photolithography, wafer thinning, and chip bonding). The disclosed structures and methods provide improved security of military electronics, sensor hardware, and clandestine intelligence operations. Heterogeneous integration technologies allow the processing of ultra-thin components (chips-to-wafers) and access to the near-surface underside (back side) of electronic circuits and sensors.

Some methods introduce three-dimensional, latent structural flaws into a thinned substrate of the component using hydrogen ion implantation. Upon thermal activation, these flaws result in localized stress regions through hydrogen gas ($H_2$) formation and embrittlement of crack regions, leading to structural failure and crystal cleavage. Activation energies of the cleavage process are mediated by the local chemical environment of the implanted region, which is controlled by the level and distribution of co-implanted species (e.g., $B^+$, $P^+$, $Si^+$, etc.). Precision backside thinning and placement of the transience-related ion implants allows incorporation without affecting device dopant levels or activity.

The concentration of interstitial hydrogen atoms in selected regions (targeted placement) of the thinned substrate may vary, for example, from about $10^{18}$/cm$^3$ to about $10^{22}$/cm$^3$. When co-implanted species are also incorporated, they may be present in a concentration in the selected regions of the thinned substrate from about $10^{15}$/cm$^3$ to about $10^{19}$/cm$^3$, for example.

In certain embodiments, multiple co-implanted species are contained in single molecules, such as phosphine ($PH_3$) to introduce P and H atoms in selected regions.

Spatial control of the implanted grid may be lithographically defined using masking patterns consisting of metal or dielectric materials, or etched structures, allowing precise control of particulate size following disintegration. Experimental data and theoretical modeling results show (100) planes of Si are especially susceptible to hydrogen-mediated cleavage. Localization and alignment of the grid pattern may therefore focus stress regions and improve cleaving of the component structure. Depth control of the hydrogen and co-implanted species (if any) may also be used to facilitate the fracture dynamics and guide hydrogen diffusion routes. Tong et al., *Appl. Phys. Lett.* 72, 49-51 (1998), which is hereby incorporated by reference herein, shows that the co-implantation of boron (p-type) dopants with hydrogen reduces the time (temperature) required to induce breakage in Si for a given temperature (time).

In addition to the primary hydrogen-based cleavage mechanism, other secondary thermal- and physical-mediated processes may be utilized to assist microsystem component disintegration. For example, large volumetric expansion (about two-fold) of the oxidation reaction products of nanoporous silicon (converting Si to $SiO_2$) will create shear forces on the silicon support network within the transient substrate. Its intimate bonding with the electronics and sensor components will transfer this force to the electronics and sensor components and other attached microsystem components. Also, the large thermal energy release from the exothermic nanoporous silicon oxidation reaction may be harnessed to aid in component cleavage through differential thermal expansion.

The persistence of the thermal exposure (known as thermal soaks) may be tailored from solid-state heat sources to optimize these thermally governed processes. In addition to tuning the nanoporous silicon oxidation chemistry and limiting conductive losses, complimentary strategies include using high-temperature phase-change materials (e.g., aluminum: $T_m$=660° C., $\Delta H_{fusion}$=398 J/g) to store the heat from the rapidly released chemical reactions.

In some embodiments, a primary disintegration mechanism relies on hydrogen-ion-mediated substrate cleavage and the forces created by the transient substrate activity. The engineered disintegration of the substrate provides a major driving force for the breakdown of the interconnect network. The natural scale of the breakup of the interconnect network may be defined by a substrate cleavage grid. Strategic engineering may be employed to integrate triggerable breakpoints registered to a pre-selected structural flaw grid installed in the chip's substrate. Optionally, other features may be incorporated to disintegrate (or better disintegrate) the interlayer dielectric and interconnect layers. Large structural changes may occur during the micro-cleaving process, and thermal transients may be used to initiate the disintegration process.

Figure 5:
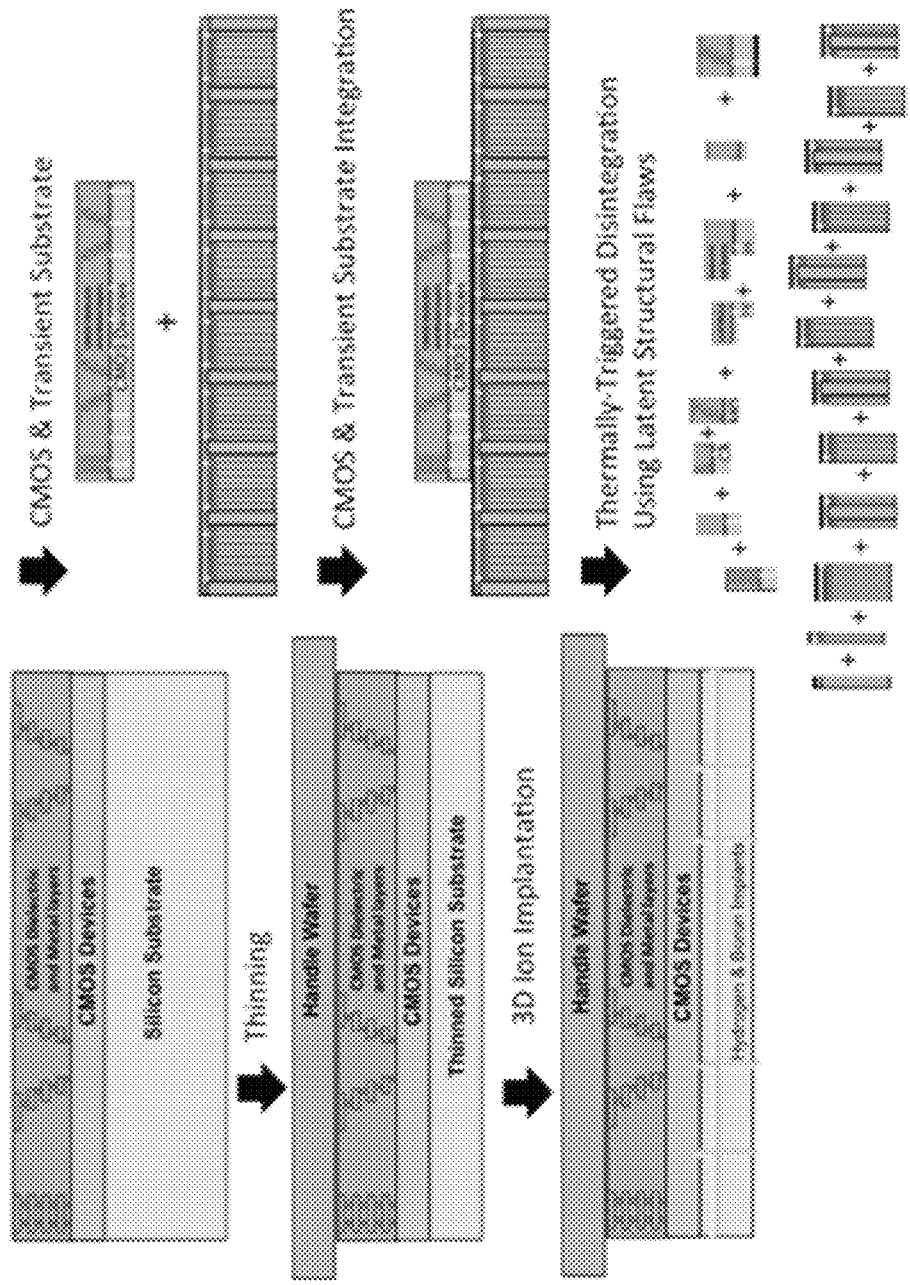
FIG. 5 depicts an exemplary process flow diagram of implantation, integration, and disintegration processes, according to some variations of the invention.

FIG. 5 depicts a process flow diagram of the implantation, integration, and disintegration processes, according to some embodiments of the invention. The process flow for integrating a programmable transient complementary metal-oxide semiconductor (CMOS) with a transient substrate is shown. Selective three-dimensional ion-implanted regions are applied to the thinned CMOS device layers and to the transient substrate crystalline silicon layer to define thermally activated high strain regions.

Variations of the invention provide a method of introducing physical transience to a semiconductor integrated circuit or sensor chip, the method comprising:

(a) fabricating or obtaining a semiconductor integrated circuit or sensor chip substrate having a front side and back side;

(b) thinning the substrate from the back side, to form a thinned substrate;

(c) implanting hydrogen ions into the back side of the thinned substrate, thereby introducing latent structural flaws in the substrate;

(d) depositing a semiconductor integrated circuit or sensor chip on the front side of the substrate; and (e) providing a controllable heating source, within, or in operable communication with, the semiconductor integrated circuit or sensor chip, wherein the controllable heating source is capable of activating the latent structural flaws.

In some embodiments of these methods, the semiconductor integrated circuit or sensor chip substrate comprises one or more materials selected from the group consisting of silicon, silicon dioxide, aluminum oxide, sapphire, germanium, gallium arsenide, indium phosphide, silicon carbide, and combinations thereof.

In some methods, step (c) includes implanting the hydrogen ions in the form of a three-dimensional grid with parallel and perpendicular planes relative to the back side. The three-dimensional grid may be characterized by an average grid spacing of about 200, 150, 100, 75, 50, 25 microns or less.

The method may further include co-implanting additional ions or atoms to reduce activation energy of hydrogen release from the thinned substrate. The additional ions or atoms may be selected from the group consisting of boron, phosphorous, silicon, aluminum, germanium, carbon, gallium, indium, arsenic, and combinations thereof.

Step (c) may be conducted prior to step (d), following step (d), or simultaneously with step (d).

In some embodiments, the controllable heating source is an internal energy source contained within the thinned substrate. For example, the thinned substrate may include silicon and an oxidant for silicon, capable of controllably oxidizing the silicon to generate heat (exothermic reaction energy) as the heating source.

In these or other embodiments, the controllable heating source is an external energy source in operable communication with the semiconductor integrated circuit or sensor chip.

The method may further comprise introducing additional latent flaws directly in the semiconductor integrated circuit or sensor chip. The additional latent flaws may include one or more thermally disintegrable features.

For example, in certain embodiments, the thermally disintegrable features are present in a conductor network, disposed on the front side of the substrate, comprising a plurality of arrays of first metal conductors and second metal conductors, wherein the first metal conductors are bridged or strapped by the second metal conductors, and wherein the second metal conductors include one or more low-melting-temperature metals with melting point less than 750° C., or a metallic mesh. The second metal conductors may include indium, tin, aluminum, gold-indium alloy, copper-tin alloy, gold-tin alloy, a silver nanowire array, or a combination thereof. The first metal conductors may be bridged or strapped by the second metal conductors parallel and/or perpendicular relative to a conductor trace direction. The metal line widths of the first metal conductors and the second metal conductors are preferably about 200, 150, 100, 75, 50, 25 microns or less.

In some embodiments of the invention, the semiconductor integrated circuit or sensor chip is a transient antenna or a portion thereof. In some embodiments, the semiconductor integrated circuit or sensor chip is a transient electronics device or system, or a portion thereof.

When physical disintegration is desired or triggered, the method further comprises converting (according to the principles disclosed herein) the semiconductor integrated circuit or sensor chip into micron-scale disintegrated particles. This event is depicted in the lower-right portion of FIG. 5.

Transience energy requirements may vary. The thermal transient energy for initiating the physical disintegration may be derived from an intimately attached transient nanoporous silicon substrate. To illustrate, the transient substrate may be designed to deliver approximately 338 J/cm$^2$ (1272 J total energy for a 3.76 cm$^2$ microsystem, a typical size of remote sensor chip) to initiate the thermal disintegration mechanism. These values are based on a 400-micron-thick nanoporous silicon substrate with a 70% pore volume and an available specific energy of 10 kJ/g (one-third of the theoretical limit).

Using heterogeneous integration methods that enable assembly and integration of thinned integrated circuits, sensor, and battery components, the mass of all of the transient microsystem components, including the transient substrate, may be about 0.3 grams (excluding packaging and antenna components) as one example. The transient microsystem components may contain PTFE with embedded porous silicon to produce their own transience energy. The time-temperature dependence of the thermally initiated, hydrogen-ion-implant cleaving (discussed in Tong et al., cited above) suggests required temperatures in the range of 300° C. to 600° C. for thermal soak times ranging from 5 minutes to 0.1 second, respectively. Assuming that the primary material component is silicon, the required energy is about 60 J to 150 J—roughly one-tenth of the substrate's available chemical energy—to raise the system's components (i.e., 0.3 grams of silicon) to these required temperature levels.

Integrating transient functionality into commercial electronics and sensors using the above approaches requires availability in bare die or wafer formats. Many commercial chips are available as bare die or in wafer form from suppliers such as Texas Instruments and other chip makers.

Including a transient security system may be a critical force multiplier that will open insertion opportunities for a wide range of existing and new or expanded military and intelligence applications, including: secure radios with transient encryption hardware; RF/GPS tracking; short-term monitoring of test ranges (RF, radiological, or seismic sensor networks); sensors for detecting perimeter penetration; and covert network monitoring. This invention provides routes to novel engineering solutions to the disintegration of "high-value" electronic components using foundry-compatible process technologies enabling transient electronics to become a scalable and deployable resource.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. An on-chip transient antenna comprising:
   (a) a semiconductor substrate having a front side and back side, wherein said semiconductor substrate contains ion-implanted interstitial hydrogen atoms, and wherein said semiconductor substrate is thermally disintegrable; and
   (b) a conductor network, disposed on said front side of said semiconductor substrate, comprising a plurality of arrays of first metal conductors and second metal conductors, wherein said first metal conductors are bridged or strapped by said second metal conductors, and wherein said second metal conductors include one or more low-melting-temperature metals with melting point less than 750° C., or a metallic mesh.

2. The transient antenna of claim 1, wherein said semiconductor substrate comprises one or more materials selected from the group consisting of silicon, silicon dioxide, aluminum oxide, sapphire, germanium, gallium arsenide, indium phosphide, silicon carbide, and combinations thereof.

3. The transient antenna of claim 1, wherein said interstitial hydrogen atoms are ion-implanted from said back side of said semiconductor substrate.

4. The transient antenna of claim 1, wherein said interstitial hydrogen atoms are disposed in a three-dimensional grid pattern within said semiconductor substrate.

5. The transient antenna of claim 1, wherein said grid pattern is characterized by a grid spacing of about 200 microns or less.

6. The transient antenna of claim 1, wherein said semiconductor substrate further contains a co-implant selected from the group consisting of boron, phosphorous, silicon, aluminum, germanium, carbon, gallium, indium, arsenic, and combinations thereof.

7. The transient antenna of claim 1, wherein said semiconductor substrate comprises silicon, wherein said semiconductor substrate further contains co-implanted boron atoms, and wherein said interstitial hydrogen atoms and said boron atoms are ion-implanted from said back side of said semiconductor substrate.

8. The transient antenna of claim 1, wherein said second metal conductors include indium, tin, aluminum, gold-indium alloy, copper-tin alloy, gold-tin alloy, a silver nanowire array, or a combination thereof.

9. The transient antenna of claim 1, wherein said first metal conductors are bridged or strapped by said second metal conductors parallel and perpendicular relative to a conductor trace direction.

10. The transient antenna of claim 9, wherein metal line widths of said first metal conductors and said second metal conductors are about 200 microns or less.

11. An off-chip transient antenna comprising:
    (a) a flexible substrate containing a polymer, nanoporous silicon particles, and an oxidant for silicon, wherein said flexible substrate is thermally disintegrable; and
    (b) a conductor network, disposed on said flexible substrate, comprising a plurality of arrays of first metal conductors and second metal conductors, wherein said first metal conductors are bridged or strapped by said second metal conductors, and wherein said second metal conductors include one or more low-melting-temperature metals with melting point less than 750° C., or a metallic mesh.

12. The transient antenna of claim 11, wherein said polymer is selected from the group consisting of polyvinylfluoride, polytetrafluorethylene, polyvinylidene fluoride, polychlorotrifluoroethylene, perfluoroalkoxy polymer, polyethylenetetrafluoroethylene, and combinations thereof.

13. The transient antenna of claim 11, wherein said oxidant for silicon is selected from the group consisting of a perchlorate, a perfluoropolymer, a metal oxide, a permanganate, sulfur, and combinations, precursors, or derivatives thereof.

14. The transient antenna of claim 11, wherein said second metal conductors include indium, tin, aluminum, gold-indium alloy, copper-tin alloy, gold-tin alloy, a silver nanowire array, or a combination thereof.

15. The transient antenna of claim 11, wherein said first metal conductors are bridged or strapped by said second metal conductors parallel and perpendicular relative to a conductor trace direction.

16. The transient antenna of claim 15, wherein metal line widths of said first metal conductors and said second metal conductors are about 200 microns or less.

17. An off-chip transient antenna comprising:
    (a) a flexible substrate containing a polymer, nanoporous silicon particles and an oxidant for silicon, wherein said flexible polymeric substrate is thermally disintegrable; and
    (b) a conductor, disposed on said flexible substrate, comprising a shape-changing nanowire that recoils into nanospheres upon heating.

18. The transient antenna of claim 17, wherein said polymer is selected from the group consisting of polyvinylfluoride, polytetrafluorethylene, polyvinylidene fluoride, polychlorotrifluoroethylene, perfluoroalkoxy polymer, polyethylenetetrafluoroethylene, and combinations thereof.

19. The transient antenna of claim 17, wherein said oxidant for silicon is selected from the group consisting of a perchlorate, a perfluoropolymer, a metal oxide, a permanganate, sulfur, and combinations, precursors, or derivatives thereof.

20. The transient antenna of claim 17, wherein said nanowire comprises silver.

\* \* \* \* \*